(12) United States Patent
Lee et al.

(10) Patent No.: US 7,238,420 B2
(45) Date of Patent: Jul. 3, 2007

(54) ALPHA $AL_2O_3$ NANOTEMPLATES

(75) Inventors: Woo Y. Lee, Ridgewood, NJ (US);
Yi-Feng Su, Rutherford, NJ (US);
Limin He, Guttenberg, NJ (US); Justin Daniel Meyer, Lexington, MA (US)

(73) Assignee: Trustees of Stevens Institute of Technology, Hoboken, NJ (US)

( * ) Notice: Subject to any disclaimer, the term of this patent is extended or adjusted under 35 U.S.C. 154(b) by 164 days.

(21) Appl. No.: 10/870,086

(22) Filed: Jun. 17, 2004

(65) Prior Publication Data

US 2007/0065657 A1    Mar. 22, 2007

Related U.S. Application Data

(63) Continuation of application No. 10/150,985, filed on May 17, 2002, now Pat. No. 6,808,760.

(60) Provisional application No. 60/292,062, filed on May 18, 2001.

(51) Int. Cl.
  *B32B 9/00*   (2006.01)
(52) U.S. Cl. ..................... 428/336; 428/469; 428/472; 428/701

(58) Field of Classification Search ................ 428/469, 428/472, 325, 336, 701
See application file for complete search history.

(56) References Cited

U.S. PATENT DOCUMENTS

| | | | | |
|---|---|---|---|---|
| 4,880,614 A | | 11/1989 | Strangman et al. ......... 428/623 |
| 5,302,465 A | * | 4/1994 | Miller et al. ................ 428/552 |
| 5,538,796 A | * | 7/1996 | Schaffer et al. ............. 428/469 |
| 5,683,761 A | * | 11/1997 | Bruce et al. ............. 427/419.2 |
| 5,716,720 A | * | 2/1998 | Murphy ...................... 148/537 |
| 5,998,003 A | * | 12/1999 | Courtright et al. .......... 428/701 |
| 6,123,997 A | * | 9/2000 | Schaeffer et al. ........ 427/419.3 |
| 6,228,513 B1 | * | 5/2001 | Jaslier et al. ............... 428/639 |
| 6,472,018 B1 | * | 10/2002 | Warnes et al. .............. 427/250 |
| 6,485,845 B1 | * | 11/2002 | Wustman et al. ........... 428/469 |
| 6,495,271 B1 | * | 12/2002 | Vakil .......................... 428/632 |
| 6,607,611 B1 | * | 8/2003 | Darolia ....................... 148/277 |
| 6,610,419 B1 | * | 8/2003 | Stamm ....................... 428/469 |
| 6,805,750 B1 | * | 10/2004 | Ristau et al. .................. 134/1 |

* cited by examiner

*Primary Examiner*—Archene Turner
(74) *Attorney, Agent, or Firm*—Licata & Tyrrell P.C.

(57) ABSTRACT

A method for preparing an $\alpha$-$Al_2O_3$ nanotemplate of fully crystalline $\alpha$-$Al_2O_3$ directly on the surface of a metal alloy is provided. Also provided is a related apparatus.

2 Claims, 1 Drawing Sheet

ALPHA $Al_2O_3$ NANOTEMPLATES

This application is a continuation of U.S. application Ser. No. 10/150,985, filed May 17, 2002 now U.S. Pat. No. 6,808,760 which claims the benefit of priority from U.S. provisional application Ser. No. 60/292,062, filed May 18, 2001, each of which are herein incorporated by reference in its entirety.

This research was sponsored by the U.S. Office of Naval Research (ONR) through Grant N00014-99-1-0281. The U.S. government may have certain rights in this invention.

BACKGROUND OF THE INVENTION

Traditional thermal barrier coatings used for rotating airfoils in aircraft engines consist of a strain-tolerant $Y_2O_3$-stabilized $ZrO_2$ (YSZ) layer prepared by electron physical vapor deposition (EBPVD) and a metallic bond coating which provides high-temperature oxidation protection. The principal failure mode of the EBPVD-Thermal barrier coatings is progressive fracture along the interface region between the metallic bond coating surface and its thermally grown oxide (TGO) upon oxidation and thermal cycling. The TGO, becomes severely strained with thermal cycling and increased scale thickness due to the large difference in coefficient of thermal expansion (CTE) between the scale and the metal. The metal-TGO interface debonds when the residual and thermal stresses exceed the strength of the interface, particularly in the presence of crack initiation sites such as voids and geometrical roughness at the interface region. Hence, the overall reliability of the EBPVD-thermal barrier coating system is not only dependent on the strain tolerance of the YSZ layer, but is also strongly dictated by the ability of its metallic bond coating to form and retain an adherent TGO upon oxidation and thermal cycling.

Bond coatings commonly used with the EBPVD-YSZ layer are MCrAlY (where M is Ni, Co, or NiCo) prepared by vacuum plasma spray (VPS); and Pt-aluminide prepared by Pt electroplating followed by aluminizing by pack cementation or chemical vapor deposition (CVD). The MCrAlY coating contains small amounts or less than a few percent by weight of what are commonly referred to as reactive elements such as Y, Hf, Zr, etc. which greatly increase TGO adhesion. The presence of Pt in the aluminide coating promotes TGO adhesion. The major role of the reactive elements is to immobilize sulfur impurities and therefore to retard their segregation to the metal-TGO interface. It is believed that the sulfur segregation weakens the degree of chemical bonding (i.e., work of adhesion) at the metal-TGO interface.

In addition, metallic bond coatings contribute significant non-load bearing "dead weight" to thin-walled turbine components. Consideration of a "bond coating-less" approach has become possible because of recent progress in casting of single-crystal Ni-alloys that are doped with a small amount of yttrium or that are desulfurized. These performance characteristics are comparable to and/or superior to those attainable with the best available MCrAlY and Pt-aluminide bond coatings. However, when the yttrium-doped or desulfurized alloys are directly bonded to an EBPVD-YSZ layer without a bond coating, inconsistent performance is generally observed. The inconsistent performance, which contradicts the excellent cyclic oxidation kinetics of these alloys, may be attributed to the inability to control localized surface defects such as Ta-rich areas and impurity contamination at the alloy surface (particularly sulfur) introduced during surface pretreatments prior to the EBPVD deposition.

U.S. Pat. No. 4,880,614 describes the presence of an $Al_2O_3$ interlayer (1 µm thick) prepared by CVD on the surface of an MCrAlY bond coating increased the burner-rig life of an EBPVD-TBC by about five-fold. Also, Sun et al. 1993 Oxid. Metals 40:465–481 describe the presence of a CVD $Al_2O_3$ layer (4 µm thick) between a plasma sprayed YSZ layer and an NiCoCrAlY bond coating layer which substantially increased the cyclic oxidation life of the YSZ layer. The rate of bond coating oxidation was reduced because of the presence of the artificial $Al_2O_3$ layer, and the formation of spinels was not observed at the TGO-YSZ interface.

Both U.S. Pat. No. 4,880,614 and Sun et al. used a CVD process which utilizes $AlCl_3$, $CO_2$, and $H_2$ as precursors at a deposition temperature of about 1000° C. This CVD process was previously developed, and is being widely used for the cutting tool industry. The non-line of sight, atomistic growth technique is attractive for manufacturing, since engineering components with intricate shapes and complex surface features can be readily coated. The CVD process is the only technique currently capable of commercially producing α-$Al_2O_3$ in the form of coherent and dense coatings. PVD methods such as sputtering, reactive sputtering, reactive evaporation, ion-assisted deposition, and cathodic arc plasma deposition are generally known to produce metastable or amorphous $Al_2O_3$, unless post-deposition annealing above 1000° C. is applied. However, the annealing of metastable and amorphous $Al_2O_3$ phases causes extensive microcracking, which is caused by volume reduction during their transformations to the thermodynamically stable α-$Al_2O_3$ phase (e.g., about 9% volume reduction for the γ-to-α-$Al_2O_3$ transition). Therefore, the annealing approach is undesirable as a method for producing an α-$Al_2O_3$ interlayer for oxidation resistance.

The present invention describes a method to increase the oxidation life of thermal barrier coatings while reducing the non-load-bearing weight of turbine components coated with a thermal barrier coating.

BRIEF SUMMARY OF THE INVENTION

An object of the present invention is to provide a method for preparing an α-$Al_2O_3$ nanotemplate of fully crystalline α-$Al_2O_3$ directly on the surface of a metal alloy comprising pretreating a metal alloy surface with a $H_2$+$CO_2$ mixture at an elevated temperature, and then chemical vapor depositing $AlCl_3$, $CO_2$, or $H_2$ precursors on the surface of the pretreated metal alloy to produce an α-$Al_2O_3$ nanotemplate.

Another object of the present invention is to provide an apparatus for producing an α-$Al_2O_3$ nanotemplate comprising at least one chamber, wherein one chamber is used for both pretreating a metal alloy with a $H_2$+$CO_2$ mixture, and for chemical vapor depositing on the metal alloy to produce an α-$Al_2O_3$ nanotemplate.

DETAILED DESCRIPTION OF THE INVENTION

Figure 1:
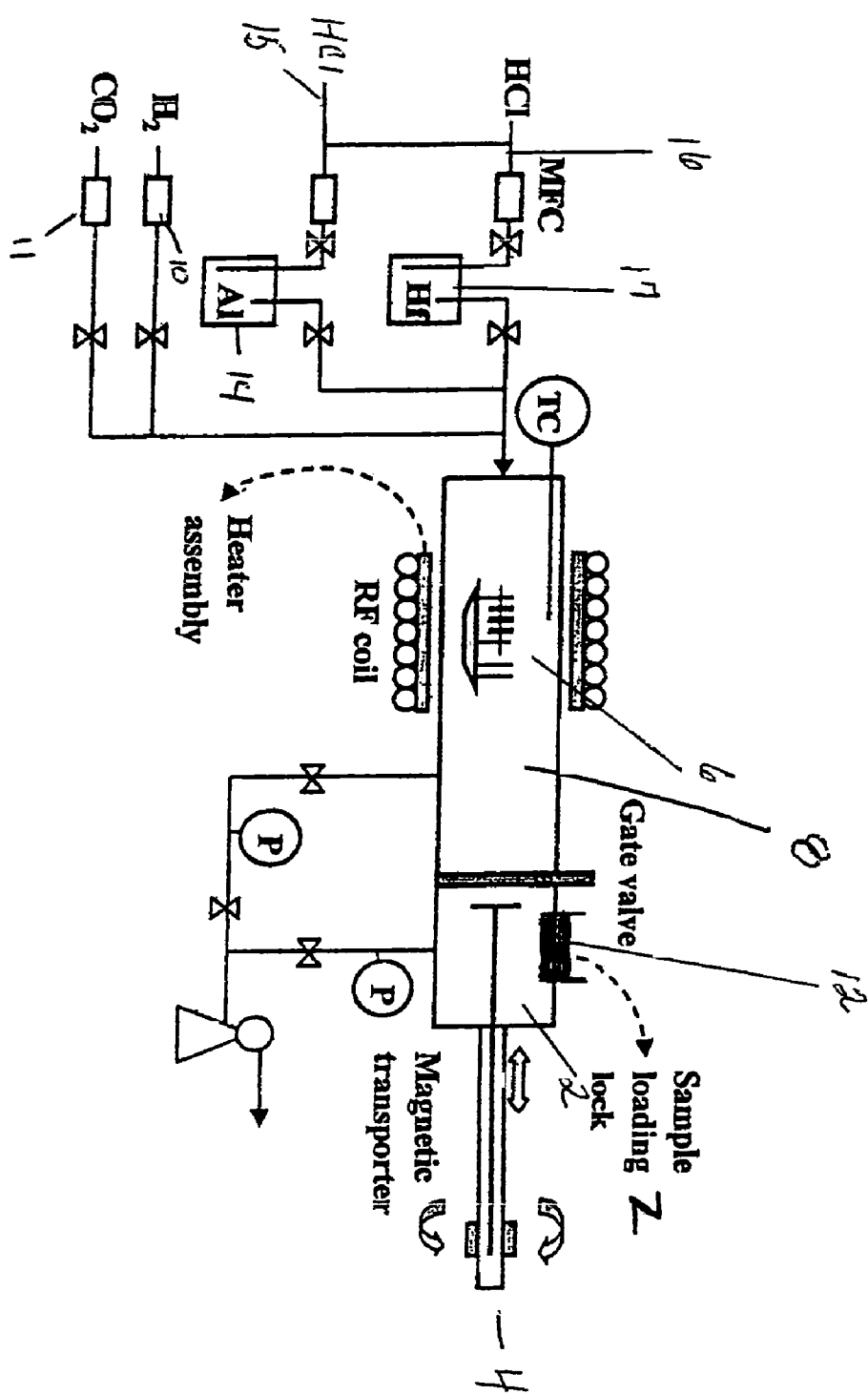
FIG. 1 is a schematic diagram of a CVD Reactor apparatus.

Thermal barrier coatings are currently used, in conjunction with air cooling, to prolong the life of metallic "hot-section" Ni-based super alloy components used in military and civilian aircraft engines with an estimated annual market size of about $1.5 billion. The life of state-of-the-art thermal barrier coatings is largely dictated by the ability of a metallic bond coating to form an adherent scale (TGO), at the metal-ceramic interface and the rate at which the TGO grows upon high-temperature oxidation. Metallic bond coatings, despite their critical importance to current TBC design, contribute significant weight to thin-walled turbine components, and exhibit serious chemical and mechanical instabilities at the substrate/bond coating/TGO interfaces during long-term exposures.

The present invention provides a method of preparing a nanotemplate of fully crystalline $\alpha$-$Al_2O_3$ directly on the surface of a metal alloy capable of forming a protective scale, by chemical vapor deposition comprising pretreating a metal alloy surface with a $CO_2+H_2$ mixture at an elevated temperature. The elevated temperature is between 1000° C. to 1200° C., preferably about 1050° C. The metal alloy is pretreated at the elevated temperature for a period of time sufficient to acquire a desired structural morphology, preferably at least one minute, prior to applying chemical vapor deposition with $AlCl_3$, $CO_2$, and $H_2$ precursors for a period of time sufficient to acquire a desired structural morphology, preferably at least ten minutes at an elevated temperature of between 1000° C. to 1200° C. Preferably the chemical vapor deposition is applied at 1050° C. in the same reactor chamber in which the metal alloy was pretreated. It is preferred that the metal alloy capable of forming a protective scale is a super alloy. By super alloy is meant to include an alloy developed for high temperature gas turbine applications. The super alloy is preferably a single crystal Ni-based super alloy.

The $\alpha$-$Al_2O_3$ nanotemplate reduces the rate of TGO growth by a factor of three through the elimination of transient oxidation and the formation of less grain boundaries within the columnar TGO structure upon oxidation at 1150° C. for 50 hours. The $\alpha$-$Al_2O_3$ nanotemplate guides the alloy surface to form a TGO that is more tenacious and slower growing than what is attainable with previous bond coatings, and consequently eliminates the need for a thick, non-load-bearing metallic coating in TBC design. The nanotemplate may range in thickness depending upon the desired application, in a preferred embodiment the nanotemplate is about 100 nm thick. The present invention can be applied for improving the oxidation and corrosion resistance of any alloy material that forms a protective scale i.e stainless steel, chromium, aluminum, iron aluminides, and nickel alloys, regardless of processing methods.

The $\alpha$-$Al_2O_3$ nanotemplate also inhibits the formation of spinels and Ta-rich oxides, through elimination of the transient stage of alloy oxidation. In the initial period of oxidation above 1100° C., metastable $Al_2O_3$ phases or spinels such as $Ni(Cr,Al)_2O_4$ form on the surface of alumina-forming Ni-alloys, instead of the thermodynamically more stable $\alpha$-$Al_2O_3$ phase. The formation of these unprotective metastable and spinel phases and subsequent transitions of the metastable phases to the $\alpha$-phase are responsible for the linear oxidation kinetics observed during this transient period as present in the form of a rapid weight increase within the first 50 hours of oxidation. With the $\alpha$-$Al_2O_3$ nanotemplate, the nucleation of spinels and Ta-rich oxides are mitigated by an epitaxial relationship between $\alpha$-$Al_2O_3$ grains at the nanotemplate/TGO interface. Thermodynamically, $\alpha$-$Al_2O_3$ is most stable on the alloy surface as long as there is a sufficient Al reservoir in the alloy to sustain $Al_2O_3$ scale growth. By inhibiting the formation of spinels and Ta-rich oxides, the nanotemplate reduces the initial growth rate of TGO, and also forms a more protective TGO morphology at the beginning stage of oxidation.

After the transient oxidation period, alumina grains in the TGO grow in a columnar fashion with the aspect ratio of column thickness to diameter of about 5. At this stage, the transport of $O^{2-}$ and $Al^{3+}$ ions through the TGO mainly occurs along grain boundaries since grain boundary diffusion is much faster than lattice diffusion $\alpha$-$Al_2O_3$ at temperatures of 1000 to 1200° C.

The development of a typical ridged morphology of a TGO surface is caused by the large volume shrinkage associated with the metastable-to-$\alpha$ transition of $Al_2O_3$. In the first few hours of the transient period, the initial TGO locally microcracks due the volume shrinkage, the rate of the phase transformations is enhanced along the corners and edges of the microcracks due to increased atomic migration at these locations and the fresh metal surface underneath the microcracks is re-exposed and rapidly oxidized. The ridged surfaces or "lacy" morphologies are commonly observed with NiAl or (Pt,Ni)Al coatings after oxidation. It is believed that the ridges may be attributed to the $Al^{3+}$ diffused outward along the short circuit path at the transient stage. Meanwhile, the oxygen diffused inward along grain boundary in the TGO contributes to the growth of the TGO at the metal-TGO interface. It is preferred that the thickness of the ridges of the nanotemplate be relatively thinner than the overall thickness of the template/TGO. Therefore, the TGO appears to grow mainly at the metal-TGO interface, and the inward diffusion of $O^{2-}$ is the predominant mechanism of the TGO growth, most likely due to the presence of Hf in the alloy and its beneficial effects as a reactive element. The $\alpha$-$Al_2O_3$ nanotemplate of the present invention comprises $\alpha$-$Al_2O_3$ grains with an average lateral diameter of about 100 to 200 nm, which reduces the rate of the TGO growth. The TGO growth rate is decreased with the $\alpha$-$Al_2O_3$ nanotemplate because the nanotemplate reduces the number and density of grain boundaries in the resulting TGO layer. The average column diameter for the nanotemplate/TGO is estimated to be about 1 μm and about 0.5 μm without the template.

The TGO is made to grow preferentially underneath the nanotemplate to reduce the formation of the ridged surface morphology. A doping approach offers a means of controlling the mechanism of diffusion during TGO growth by introducing a dopant precursor, such as $HfCl_4$, $ZrCl_4$ and other chlorides of reactive elements in the gas phase during the initial period of deposition. The diffusion rates of $Al^{3+}$ and $O^{2-}$ through grain boundaries are about the same in $\alpha$-$Al_2O_3$ at 1150° C. Nevertheless, the presence of dopants such as Hf or Zr at grain boundaries of the alumina TGO can make the rate of outward $Al^{3+}$ diffusion slower than that of inward $O^{2-}$ diffusion. A dopant precursor such as $HfCl_4$ is introduced in the gas phase during the initial period of deposition. A small amount of dopants such as Ti and Zr introduced via adding $TiCl_4$ and $ZrCl_4$ to the gas phase, has a profound effect on dictating the crystal structure of $Al_2O_3$ to be $\alpha$- or K-phase. As known to one of skill in the art, cyclic oxidation experiments may be designed as a screening tool to study the effects of a nanotemplate on the spallation life of the EBPVD-TBC system. Disc specimens (e.g., 2.54 cm diameter×0.64 cm thickness) may be coated with a nanotemplate layer and an EBPVD-YSZ layer, and then cycled to 1150° C. every hour in air. The spallation life may be measured and compared to oxidation results of other thermal barrier coatings to assess efficiency.

The $\alpha$-$Al_2O_3$ nanotemplate of the present invention also allows thermal barrier coatings to be "bond coating-less."

The overall oxidation resistance of single-crystal Ni-alloys, doped with yttrium or desulfurized, compares favorably or often superior to that of other bond coating materials. However, when these alloys are directly bonded to an EBPVD-YSZ layer without a bond coating, inconsistent performance is generally observed. This inconsistent performance is attributed to localized segregation of heavy alloying elements, impurity contamination at the alloy surface (particularly sulfur), and reaction of transient and mixed oxides in the TGO with the EBPVD-YSZ layer. The nanotemplate method of this invention can be used as a means of minimizing the adverse effects of surface defects, impurities, and reactions. The reliability of alloy surface for direct bonding with the EBPVD-YSZ layer without reliance on a thick metallic bond coating, which exhibits significant structural instabilities such as creep and rumpling as well as chemical instabilities caused by interdiffusion with underlying alloy substrates, is also ensured.

The present invention also provides an apparatus for producing an $\alpha$-$Al_2O_3$ nanotemplate comprising at least one chamber, wherein one chamber is used for both pretreating an alloy with a $H_2$+$CO_2$ mixture, and for chemical vapor depositing to produce an $\alpha$-$Al_2O_3$ nanotemplate. In a preferred embodiment, the apparatus comprises a first chamber for sample loading (sample loading chamber), and a second chamber for reaction (reaction chamber) comprising an aluminized alloy reactor chamber and a heater assembly. A sample is loaded into the first chamber and then fed into the second chamber for pretreatment with a $H_2$+$CO_2$ mixture prior to chemical vapor depositing to produce an $\alpha$-$Al_2O_3$ nanotemplate. As shown in FIG. 1, the apparatus includes a sample loading chamber comprising a sample loading lock 2 and a magnetic transporter 4. The sample loading lock 2 and the magnetic transporter 4 are used for rapid insertion and retrieval of the substrate holder 6 from the reactor chamber 8. The reaction chamber 8 is heated in the presence of flowing $H_2$ provided from an $H_2$ inlet source 10. A $CO_2$ inlet source 11 provides the reaction chamber 8 with $CO_2$. A chamber holding Al pellets 14 is positioned so that the Al can react with HCl from a first HCl supply line 15 to form $AlCl_3$ in the chamber holding Al pellets 14. Similarly, a chamber containing Hf pellets 17 is positioned so that the Hf can react with HCl from a second HCl supply line 16 to form $HfCl_4$ in the chamber containing Hf pellets 17. The coating specimens are removed from the loading chamber through the removable window 12. Mass flow controllers are used to control the flow rates of HCl for production of $AlCl_3$ and $HfCl_4$ as well as $H_2$ and $CO_2$ flow rates. The reaction chamber and the sample loading chamber are pre-aluminized by pack cementation prior to coating experiments. Preferably, the chamber for reaction is an IN600 alloy reactor chamber. Dimensions of the reactor may vary, but preferably are 6-cm diameter×36-cm length. More preferably the sample loading chamber is an IN600 sample holder. The ability to rapidly quench coating specimens is important, so that the samples will not be subjected to slow furnace cooling which might cause phase transformations in the nanotemplate layer. The surface temperature of the substrates may be cooled to about 200° C. in several minutes during the retrieval of the sample holder from the reaction chamber to the sample loading chamber. In a preferred embodiment the CVD reaction chamber is heated to 1050° C. (±5° C.) in flowing $CO_2$. Prior to inserting the sample holder into the hot reaction chamber, both the reaction and sample loading chambers are evacuated to about 13 Pa. Substrates are placed on the substrate holder, and the substrate holder is inserted into the chamber. Subsequently, the reactor pressure is increased to a desired level of about 1.3 K Pa using an Ar stream. At this point, the $H_2$+$CO_2$ mixture is introduced into the chamber for 1 minute and subsequently $AlCl_3$ is added to the $H_2$+$CO_2$ stream for a period of 10 minutes. A treated substrate without the $H_2$+$CO_2$ pretreatment step (for 1 minute) developed a coating with fibrous morphology although the coating was $\alpha$-$Al_2O_3$. With this pretreatment, the coating forms a denser morphology. After the ten minute deposition step, the $AlCl_3$, $CO_2$, and $H_2$ flows are stopped, the reaction chamber is evacuated and the substrate holder is retrieved from the reaction chamber. The reaction and sample loading chambers are then pressurized with Ar to the atmospheric pressure, and the two chambers are then isolated by closing the gate valve. The coating specimens are removed from the loading chamber through a removable window. Processing conditions used for this preferred template synthesis included a temperature of about 1050° C., a total pressure of (kpa) of about 1.3; $CO_2$ ($cm^3$/min) of 240; $CO_2$ ($cm^3$/min) of 250; and HCl ($cm^3$/min) of 20 for producing $HfCl_3$.

The surface pretreatment by the $H_2$+$CO_2$ gas flow selectively oxidizes the Al atoms on the alloy surface. At very low oxygen partial pressures, $Al_2O_3$ forms first instead of transient mixed oxides (i.e., selective Al oxidation). The $H_2$+$CO_2$ pretreatment could be thought of as a low oxygen pressure environment due to the slow kinetics of water vapor generation by the reverse water-gas shift reaction. It is also believed that the $H_2$+$CO_2$ pretreatment preferentially promotes the formation of $\alpha$-$Al_2O_3$ nuclei on the alloy surface. In the subsequent CVD step, the $\alpha$-$Al_2O_3$ nuclei coalesced laterally to form the continuous $\alpha$-$Al_2O_3$ layer to a thickness of about 100 nm.

One of skill in the art may employ the method of the present invention for example for TGO (or scale) engineering, or for improving the oxidation and corrosion resistance of any alloy material that forms a protective scale, particularly alumina and chromia scale forming alloys, regardless of processing methods.

This invention is further illustrated by the following non-limiting examples.

EXAMPLES

Example 1

CVD Process

In the cutting tool industry, substrates are usually pre-coated with TiC and TiN interlayers as diffusion barriers prior to the $Al_2O_3$—CVD step because some of the substrate elements and impurities (particularly Co) are found to cause the formation of metastable phases or undesired morphological features such as whiskers during the coating growth. Another important processing feature is that air which leaks into the CVD process must be tightly controlled in order to avoid the development of "cauliflower" growth morphology and powder formation in the gas phase.

In this CVD process $AlCl_3$ is generated by passing HCl over Al chips:

$$2Al(s)+6HCl(g) \rightarrow 2AlCl_3(g)+3H_2(g) \quad \text{(Eq. 1)}$$

A $CO_2$+$H_2$ gas mixture is fed into the reactor to form water vapor inside the reactor chamber utilizing the reverse water-gas shift reaction:

$$H_2(g)+CO_2(g) \rightarrow H_2O(g)+CO(g) \quad \text{(Eq. 2)}$$

Subsequently $AlCl_3$ and $H_2O$ react as follows:

$$2AlCl_3(g)+3H_2O(g) \rightarrow Al_2O_3(s)+6HCl(g) \quad \text{(Eq. 3)}$$

The overall reaction for the CVD-$Al_2O_3$ process is:

$$2AlCl_3(g)+3H_2(g)+3CO_2(g) \; Al_2O_3(s)+6HCl(g)+3CO(g) \quad \text{(Eq. 4)}$$

The in situ generation of the $H_2O$ vapor (Eq. 2) is preferred because the kinetics of the $H_2O$ generation is relatively slow at high temperature environments, and therefore can act as a time-controlled reservoir of $H_2O$. For example, if $H_2O$ were introduced directly into the reaction system, there would be homogeneous nucleation in the vapor phase near the gas inlet, resulting in alumina powder formation due to rapid reaction between $H_2O$ and $AlCl_3$. The use of the $H_2+CO_2$ mixture increases the deposition zone, allowing for more uniform coating deposition over larger substrate geometries. Also, as the rate-determining step of the overall reaction (Eq. 4), the reverse water-shift reaction (Eq. 2) serves as a mechanism of controlling the growth rate of $Al_2O_3$.

The CVD-$Al_2O_3$ process, previously developed at SECO Tools AB, Sweden for the cutting tool industry, was used to prepare CVD-$Al_2O_3$ on the Ni alloy substrate, in order to define the baseline behavior with the process used in the cutting tool industry. SEM/EDS, XRD, and luminescence characterization data suggested that the CVD alumina coating directly deposited on René N5 was essentially made of about 1 mm $\alpha$-$Al_2O_3$ crystals in a matrix of amorphous $Al_2O_3$. The coating surface consisted of two distinct features faceted crystals of about 0.5–1.5 μm and a glassy, web-like phase. The coating surface was not fully dense due to the lack of coalescence among the crystals as well as the presence of the glassy/amorphous phase between the crystals. The coating was about 1 μm thick, and contained Al and O only when examined by EDS. The interface at the coating layer and the alloy surface did not appear to be particularly sharp, although the alloy surface was polished to about 0.05 μm before the coating process. The XRD and luminescence analyses of the coating, before and after annealing at 1100° C., were indicative of a significant part of the coating being amorphous as deposited, and subsequently crystallized upon the oxidation treatment. The results indicated that the nucleation and growth of a $\alpha$-$Al_2O_3$ layer on the Ni superalloy surface, without forming a significant amount of amorphous $Al_2O_3$, would be difficult through simple adaptation of the CVD process previously developed for the cutting tool industry.

Example 2

Production of an $\alpha$-$Al_2O_3$ Nanotemplate

Synthesis using a single crystal Ni alloy (René N5; General Electric Company, Fairfield, Conn.) was cast as a cylindrical rod with the seed direction. The alloy rod was sliced radially to produce disc specimens (0.1 cm thickness ×1.2 cm diameter) while preserving the orientation on the disc surface. The nominal composition (in weight %) of the alloy is: 6.2 Al, 0.05 C, 7.5 Co, 7.0 Cr, 0.16 Hf, 1.5 Mo, 3.0 Re, 6.5 Ta, 0.02 Ti, 5.0 W, and Ni as the balance. This alloy was melt-desulfurized to below 1 ppm sulfur. The specimen surface was polished prior to coating experiments with 0.05 μm $Al_2O_3$ suspension.

Morphology and composition of experimental specimens were examined using a field emission scanning electron microscope (SEM, LEO 982, LEO Electron Microscopy Inc., Thornwood, N.Y.) equipped with an energy dispersive spectroscopy (EDS). In order to minimize the charging problems associated with the nonconductive specimens, an Au-Pd layer was sputtered on the sample surfaces along with the use of carbon tape and silver paste. A field-emission transmission electron microscope (Philips CM20 FEG TEM/STEM) was also used for phase determination and composition analysis. TEM specimens were prepared by tripod-polishing followed by ion milling. X-ray diffraction (XRD, Siemens Diffractometer D5000), with capability to perform grazing incidence XRD (GIXRD) measurements, was used for independent phase determination. The GIXRD technique was particularly useful for analyzing the nanotemplate layer while reducing contributions from the substrate peaks, as the incident angle provides a very shallow penetration depth into the sample.

Luminescence spectroscopy was also used to determine the presence of $\alpha$-$Al_2O_3$ in the template layer as well as to infer the average hydrostatic stress status of the $\alpha$-$Al_2O_3$ phase. $\alpha$-$Al_2O_3$ has trigonal symmetry with rhombohedral Bravis centering and can possess trace amounts $Cr^{3+}$ cation impurities. The $Cr^{3+}$, having the same valency as $Al^{3+}$, substitute for them in the alumina crystal lattice easily. When excited by a laser, the electrons of the $Cr^{3+}$ emit photons. The two characteristic photon energies for the $\alpha$-$Al_2O_3$ phase are: 14402 (R1) and 14432 $cm^{-1}$ (R2). In contrast, most of the other metastable alumina phases do not exhibit fluorescence peaks. When there is a stress in the $\alpha$-$Al_2O_3$ phase, there is a physical shifting of the lattice as a whole and the relative positions of the oxygen and chromium ions in particular. This shifting changes the electronic environment of the chromium, and there is a corresponding shift in the R1 and R2 lines. In this work, a Dilor XY 800 triple stage Raman microprobe and a coherent Innova 308C Argon ion laser operating at 514.5 nm with a 100 mW output power were used. The laser was focused onto areas of interest with an optical objective providing a spatial resolution of 2 or 10 mm, depending on the objective used.

Example 3

Oxidation Exposure

A polished, uncoated René N5 (0.05 mm finishing) and the same alloy coated with the $\alpha$-$Al_2O_3$ template, as described in Example 2, were oxidized inside a fused silica tube using a horizontal furnace at 1150° C. for 50 hours. The furnace was heated prior to the oxidation experiment. Samples were placed onto an $Al_2O_3$ boat and inserted to the furnace as soon as the desired temperature was achieved and stabilized. After 50 hours, the boat was pulled out and cooled in air, and the samples were removed from the boat. All specimens were weighed before after oxidation to an accuracy of 0.001 mg.

Example 4

Effects of Nanotemplate on TGO Morphology and Growth Kinetics

The TGO formed on the Rene N5 surface (as-polished without the nanotemplate) exhibited two types of surface features, i.e., polygonal grains (about 1 μm) as well as very small "white contrast" particles (about 100 nm). The average thickness of the TGO was about 2.1 μm thick. As the TGO grows in the inward direction toward the metal-TGO interface, a columnar morphology develops with coarser grains. The normalized weight change for this sample after the oxidation step was about 0.45 mg/cm². Effects of the α-Al$_2$O$_3$ nanotemplate on TGO morphology and growth after isothermal oxidation at 1150° C. for 50 hours are compared with the nanotemplate and without the nanotemplate. The average thickness of the nanotemplate/TGO thickness was about 0.7 μm. Therefore, with the initial nanotemplate thickness of about 0.1 μm, the TGO grew only about 0.6 μm after 50 hours of oxidation. This was confirmed by the weight change of about 0.15 mg/cm² for the nanotemplate sample after the oxidation treatment. Both the metallographic and weight data indicated that the TGO grew about three times slower with the nanotemplate after 50 hours of oxidation at 1150° C. With the nanotemplate, a network of ridges was observed on the nanotemplate/TGO surface instead of the bimodal distribution of the equiaxed grains observed without the nanotemplate. Inside the ridges, the nanotemplate/TGO surface looked rather smooth and no distinguishable morphological feature was observed. The average thickness of the ridges measured from the flat surface inside from the ridges was about 100 nm. Luminescence spectra show that the average hydrostatic stress in the nanotemplate +TGO layer has somewhat changed, but all are highly compressed. High compressive stress in the TGO has been found to be a good measure of adherent and inward-growing TGO. The average stress in the as-deposited template was measured to be −4.8 GPa, and decreased to −3.9 GPa for the nanotemplate/TGO upon oxidation. For comparison, the TGO formed on René N5 without the template was −5.2 Gpa. The most notable observation was that the nanotemplate/TGO with the template was highly compressed, demonstrating that the quality of the TGO was excellent. Any TGO spallation was not observed from the planar or the cross sectional SEM views. The nanotemplate reduced the rate of TGO growth on the surface of René N5 by a factor of three. The observed TGO growth is slower than the oxidation kinetics previously measured for cast NiAl doped with Hf and NiAl and (Ni,Pt)Al bond coatings.

What is claimed is:

1. An alpha dialuminum trioxide nanotemplate comprising fully crystalline alpha dialuminum trioxide grains having an average lateral diameter of about 100 to about 200 nanometers applied at a thickness of about 100 nanometers directly to a material surface comprising a metal alloy.

2. The alpha dialuminum trioxide nanotemplate of claim 1 wherein the metal alloy is a super alloy developed for high temperature gas turbine applications.

* * * * *